(12) United States Patent
Schuster et al.

(10) Patent No.: US 6,504,597 B2
(45) Date of Patent: Jan. 7, 2003

(54) OPTICAL ARRANGEMENT

(75) Inventors: Karl-Heinz Schuster, Königsbronn (DE); Hubert Holderer, Königsbronn (DE); Rudolf Von Bünau, Essingen (DE); Christian Wagner, Aalen (DE); Jochen Becker, Oberkochen (DE); Stefan Xalter, Oberkochen (DE); Wolfgang Hummel, Schwäbisch Gmünd (DE)

(73) Assignee: Carl-Zeiss-Stiftung (DE)

( * ) Notice: Subject to any disclaimer, the term of this patent is extended or adjusted under 35 U.S.C. 154(b) by 0 days.

(21) Appl. No.: 09/755,423

(22) Filed: Jan. 5, 2001

(65) Prior Publication Data

US 2001/0019403 A1 Sep. 6, 2001

(30) Foreign Application Priority Data

Jan. 5, 2000 (DE) .......................... 100 00 191

(51) Int. Cl.$^7$ .................. G03B 27/54; G03B 27/52; G03B 27/72; G02B 7/02; A61N 5/00
(52) U.S. Cl. .................. 355/67; 355/30; 355/35; 355/53; 355/55; 355/57; 359/820; 250/492.2; 250/492.22
(58) Field of Search ............... 355/30, 35, 53, 355/55, 67, 57; 359/820; 250/492.2, 492.22

(56) References Cited

U.S. PATENT DOCUMENTS

| | | | | |
|---|---|---|---|---|
| 5,805,273 A | * | 9/1998 | Unno | 355/30 |
| 5,883,704 A | | 3/1999 | Nishi et al. | |
| 5,995,263 A | * | 11/1999 | Tokuda et al. | 359/196 |
| 6,018,384 A | * | 1/2000 | Ota | 355/53 |
| 6,100,961 A | * | 8/2000 | Shiraishi et al. | 355/67 |
| 6,256,086 B1 | * | 7/2001 | Sumiyoshi | 355/55 |

* cited by examiner

*Primary Examiner*—Russell Adams
*Assistant Examiner*—Khaled Brown
(74) *Attorney, Agent, or Firm*—Factor & Partners

(57) ABSTRACT

An optical arrangement, in particular a microlithographic projection printing installation, has in particular a slot-shaped image field or rotationally non-symmetrical illumination. An optical element (1) is therefore acted upon in a rotationally non-symmetrical manner by the radiation of the light source. A compensating light supply device (11, 14 to 19) is optically coupled via the peripheral surface (13) of the optical element (1) to the latter. It supplies compensating light (16, 12) to the optical element (1) in such a way that the temperature distribution in the optical element (1), which arises as a result of cumulative heating of the optical element (1) with projection light (2) and compensating light (12), is at least partially homogenized. In said manner image defects induced by the projection light are corrected.

15 Claims, 3 Drawing Sheets

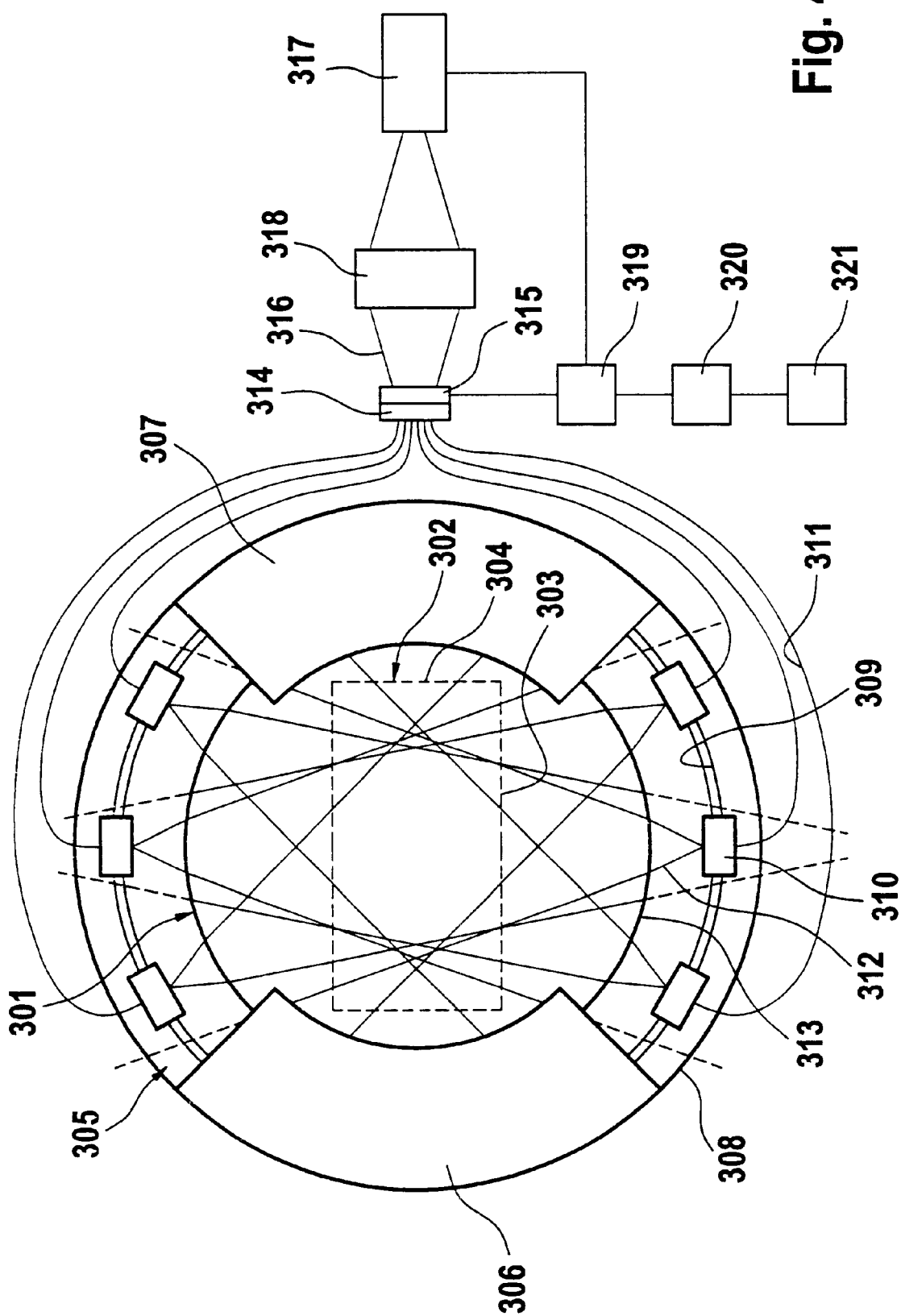

OPTICAL ARRANGEMENT

BACKGROUND OF THE INVENTION

The invention relates to an optical arrangement, in particular to a microlithographic projection printing installation, in particular having a slot-shaped image field or rotationally non-symmetrical illumination, a) comprising an optical element;

b) comprising a projection light source which emits radiation, wherein the surface of the optical element is acted upon by the radiation of the projection light source in a rotationally non-symmetrical manner;

c) and comprising a compensating light supply device which supplies compensating light to the optical element in such a way that the temperature distribution in the optical element arising as a result of cumulative heating of the optical element with projection light and compensating light is at least partially homogenized.

The imaging quality of an optical arrangement, which is acted upon in a rotationally non-symmetrical manner by light, is often impaired by rotationally non-symmetrical image defects. Such image defects arise, for example, not only as a result of rotationally non-symmetrical light-induced heating of the, with regard to the projection light, refractive or reflective optical element but also as a result of other light-induced effects, such as e.g. compaction, which lead to a corresponding rotationally non-symmetrical expansion and/or refractive index distribution in the optical element. When high imaging quality is required, as it is in particular for microlithographic projection printing processes, the described light-induced image defects cannot be tolerated.

From the generic EP 0 823 662 A2 an optical arrangement of the type described initially is known, in which by means of the use of a compensating light source an attempt is made to achieve an at least partial reduction of such image defects. This is effected by a homogenization of the temperature distribution in the optical system via the absorption of the compensating light which is effected there. The compensating light is in said case guided parallel to the optical axis through edge regions of the optical elements which are not acted upon by projection light. As a result, the effective aperture of the optical arrangement which is usable for projection printing is restricted. The necessary input coupling of the compensating light parallel to the optical path of the projection light leads additionally to structural integration problems because additional input coupling and/or deflection elements have to be inserted into and/or adjacent to the optical path of the projection light.

The object of the present invention is therefore to develop an optical arrangement of the type described initially in such a way that the temperature distribution in the optical element may be rendered symmetrical and/or homogenized through the use of compensating light without adversely affecting the usable aperture.

SUMMARY OF THE INVENTION

Said object is achieved according to the invention in that the compensating light supply device is optically coupled via the peripheral surface of the optical element to the latter.

The input coupling of the compensating light via the peripheral surface leads to the possibility of full utilization of the aperture of the optical arrangement for the projection light because a restriction caused by the compensating light beam guidance is avoided. As the optical paths of projection light and compensating light now no longer extend adjacent or parallel to one another, the optical arrangement may be structurally rectified. In addition, the peripheral surface of the optical elements may be designed independently of the optical surfaces for the projection light so that guidance of the compensating light may be optimized independently of guidance of the projection light. Since optical elements generally have a greater dimension perpendicular to the optical axis than parallel thereto, with input coupling via the peripheral surface there is mostly also a greater material distance available for absorption of the compensating light, with the result that greater freedom exists when selecting the wavelength of the compensating light.

The compensating light supply device may comprise a light source and at least one optical fibre, in which the radiation emitted by the light source is supplied to the optical element. Given the use of a light source, which is independent of the projection light source, it may be accommodated spatially independently of the optical arrangement. With optical fibres it is possible to realize a structural design of the input coupling into the peripheral surface of the optical element which, as a rule, does not lead to a substantial increase of the cross section of the optical arrangement. The output divergence from optical fibres may be utilized to irradiate a relatively large region of the optical elements with compensating light.

Advantageously, at least two optical fibres may be provided and the light outputs guided in each case through said at least two optical fibres may be adjustable independently of one another by means of a control device. By means of such a distribution of the light outputs guided in the individual optical fibres a purposeful influencing of the temperature distribution generated in the optical element by absorption of the compensating light is possible for compensating image defects.

The control device may have a communication link to a sensor monitoring the focal plane of the optical arrangement and may process the signals received from the sensor for control of the light output. In said manner a regulation of the imaging quality is possible, whereby imaging quality changes detected by the sensor are automatically corrected.

The sensor may be a position-sensitive sensor. Such sensors are available in a very inexpensive design, e.g. in the form of quadrant detectors.

The sensor is preferentially a CCD array. Such a sensor guarantees very sensitive determination of the imaging quality of the optical arrangement. A relatively simple construction of the control device is possible, in the present case, through the use of known image processing algorithms.

In a refinement of the invention, the compensating light supply device comprises a light source of variable wavelength. The wavelength provides an additional degree of freedom when adjusting a temperature distribution in the optical element to compensate image defects. For, given the use of a light source having a wavelength, which is adjustable in a range, in which the absorption coefficient of the material of the optical element significantly changes, by changing the wavelength it is possible to realize a change of the depth of penetration of the compensating light into the optical element and hence a corresponding change of the temperature distribution in the latter. Typical wavelength regions, which may be used here, are the long-wave absorption edge in quartz glasses in the region of 4 $\mu$m or a region—occurring in many quartz glasses—of increased intrinsic absorption at 1400 nanometers of a wavelength which may be achieved e.g. by an indium-phosphide diode laser.

In a further refinement of the invention, a holding component for the end of the at least one fibre directed towards the optical element is attached to a mount for the optical element. This leads to a reliable positioning of the output end of the fibre relative to the optical element. Given the use of a detachably mounted holding component, easy exchange of the fibre and easy repositioning of the replacement fibre is guaranteed.

For guidance of the holding component in peripheral direction of the optical element an adjusting device may be provided. Such an adjusting device may be used to adjust both the position, at which the compensating light is coupled into the optical element, and the input coupling direction or alternatively the distance of the output end from the peripheral surface of the optical element. Said degrees of freedom allow an additional influencing of the intensity distribution of the compensating light in the optical element and hence, via the absorption of the compensating light, an influencing of the temperature distribution in said optical element.

For the adjusting device a motor-driven actuator may be provided, which has a communication link to a control device, which in turn has a communication link to a sensor monitoring the focal plane of the optical arrangement and processes the signals received from the sensor for control of the position of the holding components. Thus, automatic correction of image defects is enabled through adjustment of the holding components.

The peripheral surface of the optical element may have facets at compensating light input regions. Such facets enable guidance of the compensating light beam as a result of the refraction at the facet surface. The facets may be e.g. convex, leading to a concentration of compensating light impinging divergently on the facets. If, on the other hand, the shape of the facets is concave, a divergence of the impinging compensating light beam may be realized. When the radius of curvature of concave facets corresponds to the divergence of impinging compensating light such that the compensating light rays meet the facet surface at right angles, there is no influencing of the divergence by refraction at the peripheral surface of the optical element.

The peripheral surface of the optical element may be textured at compensating light input regions. In the simplest case, such texturing is provided by the normally roughly ground peripheral surface of the optical element. The compensating light striking a textured peripheral surface is diffused, thereby promoting the distribution of the compensating light in the optical element. Other types of texture of the peripheral surfaces for influencing the guidance of the compensating light beam are conceivable, e.g. in the manner of a diffractive optical element.

When the emission wavelength of the light source is greater than 4 µm, a relatively high absorption of the compensating light is guaranteed. In said case, in order to achieve a specific heat output, for the compensating light it is therefore possible to use light sources with a relatively low optical output.

The optical element may be a refractive optical element. Such refractive optical elements, e.g. in the form of lenses or plane-parallel plates, are standard equipment in known projection printing installations.

Alternatively, the optical element may be reflective as regards the radiation of the projection light source. Because of residual absorptions of the projection light in the reflective surface such a mirror for the projection light also experiences a heat contribution, which substantially presents the symmetry of the impingement with projection light. When the mirror in accordance with the invention is designed in such a way that the compensating light supply device is coupled to its peripheral surface, then, here too, an image defect induced by the projection light may be compensated by absorption of the compensating light. A typical realization of such a mirror comprises a reflective coat on a transparent substrate.

BRIEF DESCRIPTION OF THE DRAWINGS

Embodiments of the invention are described in detail below with reference to the drawings; the drawings show:

FIG. 4: a view, similar to FIG. 1, of a further alternative form of construction.

DETAILED DESCRIPTION OF THE DRAWINGS

Figure 1:
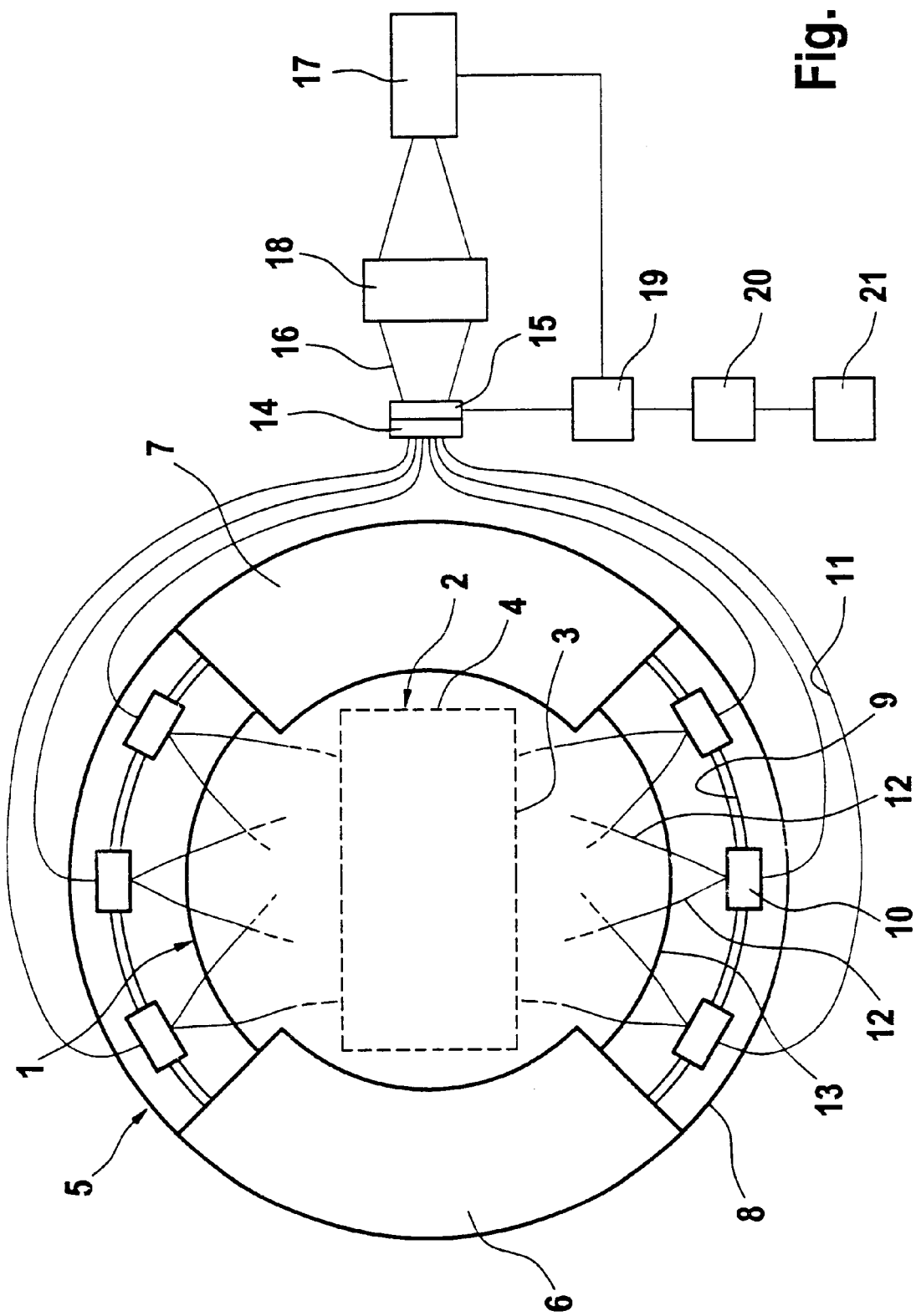
FIG. 1: a plan view of a lens arrangement which is image-corrected in accordance with the invention.

The image-corrected lens 1 shown in FIG. 1 is part of the optical arrangement of a microlithographic projection printing installation. During projection printing the lens 1 is acted upon by a projection light beam 2, the rectangular cross-sectional area of which is illustrated by dashes in FIG. 1. The length ratio of a longitudinal side 3 to a narrow side 4 of said cross-sectional area is typically 2:1.

The projection light beam 2 is the UV emission beam of a non-illustrated projection light source, e.g. an argon-fluoride excimer laser. The lens 1 is made of quartz glass. At its surfaces, through which the projection light beam 2 passes, it is provided in a known manner with an anti-reflecting coat.

The lens 1 is disposed in a mount 5. To fasten the lens 1 in the mount 5, the latter is clamped by means of a screw-on ring (not shown) in FIG. 1 from the rear against two seating portions 6, 7. The latter are formed on an annular basic housing 8 of the mount 5 in the form of mutually opposing ring segments, which each extend over an angular region of approximately 90°. The inside diameter defined by the two seating portions 6, 7 is smaller than the diameter of the lens 1, thereby producing two regions of the seating portions 6, 7 against which the lens 1 lies.

The projection light beam 2 is introduced in such a way that the narrow sides 4 of its cross-sectional area are directed in each case towards the seating portions 6, 7.

In each of the two 90° ring segments of the basic housing 8 which close the regions, on which the seating portions 6, 7 are formed, into the complete ring, an arc-shaped guide groove 9 coaxial with the optical axis of the lens 1 is milled in a surface radially adjacent to the peripheral surface 13 of the lens 1. Said guide groove 9 forms part of a known dovetail tongue-and-groove combination, into which springs (not shown) formed on holding blocks 10 engage.

In the holding blocks 10, which are in said manner displaceable in peripheral direction in the region of the guide grooves 9 of the basic housing 8, the ends of optical fibres 11 are mounted in a manner not shown in detail.

The holding blocks 10 are part of a compensating light supply device, which is described below:

With each of the altogether six holding blocks 10, which are arranged in mutually opposing groups of three holding blocks 10, an end of one fibre 11 is associated. Light beams 12, which emerge from the ends of the fibres 11, strike and penetrate the peripheral surface 13 of the lens 1. The light beams 12, because they are introduced at right angles to the optical axis of the projection light impingement, are referred to hereinafter as transverse light beams 12. The transverse light beams 12 have a wavelength, which is greater than 4 μm and lies in the absorption range of the quartz glass used to manufacture the lens 1.

The optical fibres 11 are made of a glass material which, at the wavelength of the transverse light beams 12, does not present any significant absorption.

At their input ends the optical fibres 11 are combined into a fibre bundle in an input holding block 14. Connected upstream of the input holding block 14 is an optical output distributor 15, which distributes the output of an input light beam 16, which is imaged onto the fibre bundle, among the individual fibres 11. Such output distributors 15 are known in various forms of construction. The output distribution may be achieved e.g. by polarizing optical components associated with the individual fibres 11 or by suitable filters associated with the fibres 11 or alternatively by an individual input adjustment of the fibres 11 to influence the light quantity of the input light beam 16 coupled into the individual fibres 11.

The input light beam 16 is emitted by an infrared light source, e.g. a laser 17, and imaged by means of imaging optics 18 onto the fibre bundle of the fibres 11.

The output distributor 15 and the laser 17 have a communication link to an output control circuit 19. The latter in turn has a communication link to a printing control circuit 20, which in turn receives signals from a sensor arrangement 21 which may be, for example, a two-dimensional CCD array.

Image correction of the lens 1 is effected in the following manner:

By means of the projection light beam 2 with a rectangular cross-sectional area in the region of the lens 1 the latter is heated on account of the residual absorption of the material of the lens 1 at the wavelength of the projection light beam 2. The temperature distribution resulting from said heating initially presents the symmetry of the light channel of the projection light beam 2 in the lens 1. It leads both to thermal expansion of the material as well as to a change of refractive index and hence, because of the changed refractive properties, to a change of the imaging properties of the lens 1.

By means of the transverse light beams 12 fed in via the peripheral surface 13 of the lens 1 a further heat contribution is delivered likewise as a result of light absorption. However, because of the high absorptive capacity of the material of the lens 1 at wavelengths greater than or equal to 4 μm, the transverse light beams 12 penetrate the lens 1 only to a specific depth. They generally do not reach the region 2 of the lens 1 irradiated by the projection light beam 1, with the result that the heat corresponding to the absorbed light output arises practically in the lateral regions of the lens 1 which are situated outside of the projection light beam 2.

The temperature distribution in the lens 1 as a result of said heat contribution is therefore dependent upon the introduced individual outputs of the transverse light beams 12, their wavelength and the shape and superimposition of the transverse light beams 12 in the lens 1. The purpose of the additional heating of the lens 1 by the transverse light beams 12 is to render the temperature distribution symmetrical and/or achieve a preselected shape of the temperature distribution in said lens. This leads to controllable imaging properties.

On the basis of empirical values said parameters are selected so as to produce as homogeneous a temperature distribution as possible in the lens 1 on account of the heat contributions arising from the residual absorption of the projection light beam 2 and from the purposeful absorption of the transverse light beams 12. Said homogenization of the temperature distribution leads ideally to the elimination of residual-absorption-induced image defects of the lens 1 during projection printing.

The imaging quality of the optical arrangement of the projection printing installation is monitored by the sensor arrangement 21, which is situated in a focal plane of the optical arrangement. Using known image acquisition algorithms said image acquired by the sensor arrangement 21 is evaluated especially as regards the occurrence of image defects. Said evaluation is effected in an arithmetic unit which is part of the printing control circuit 20.

On the basis of the imaging quality thus acquired, the printing control circuit 20 assigns setpoint values for the outputs of the individual transverse light beams 12 so that the best possible homogenization of the temperature distribution in the lens 1 is achieved by the combined absorptions of projection light beam 2 and transverse light beams 12.

The setpoint values for the outputs of the transverse light beams 12 are relayed by the printing control circuit 20 to the output distributor 15, which effects a corresponding distribution of the output of the input light beam 16 among the various fibres 11.

As an alternative to an individual laser 17 arrangements are also conceivable, in which a plurality of light sources are used for the transverse light beams 12. In particular, a separate light source may be associated with each optical fibre 11. The output distribution among the individual fibres 11 is then effected by suitable actuation of the drivers of the respective light sources.

An output change of the light output of a transverse light beam 12 leads to a corresponding change of the absorbed light quantity of said transverse light beam 12 in the lens 1. Thus, by means of the distribution of the output among the six transverse light beams 12 coupled into the lens 1 the shape of the temperature distribution in the lens 1 may be influenced. Via the feedback on the basis of the imaging quality measured by the sensor arrangement 21 it is possible in an iterative process to adjust a temperature distribution which leads to minimizing of the image defects of the lens 1.

An additional degree of freedom for the shaping of the temperature distribution is provided by displacement of the holding blocks 10 along the guide grooves 9 and a corresponding change of the superimposed structure of the transverse light beams 12.

In an alternative non-illustrated form of construction, the displacement of the holding blocks 10 along the guide grooves 9 may be effected in a motor-driven manner. When such a motor-driven displacement of the holding blocks 10 is initiated likewise via the printing control circuit 20, an additional, automatically adjustable degree of freedom is created for the shaping of the temperature distribution in the lens 1. The thus possible adjustment of the input position of the transverse light beams 12 may be controlled likewise by the printing control circuit 20 in dependence upon the evaluated measurement data of the sensor arrangement 21.

Depending on the standards of accuracy demanded of the image correction, the number of transverse light beams 12 used may vary. It is conceivable, for example, to use only two transverse light beams 12, which are coupled opposite one another into the peripheral surface 13 of the lens 1.

In the simplest case, no further shaping of the transverse light beams 12 occurs after they are coupled out of the fibres 11. The transverse light beams 12 then penetrate as divergent beams into the peripheral surface 13 of the lens 1, wherein their divergence is reduced in the material of the lens 1 in a plane perpendicular to the optical axis of the lens 1 (drawing plane of FIG. 1) on account of the refraction at the peripheral surface 13, which acts like a convex lens.

The peripheral surface 13 may be specially treated to optimize the input coupling of the transverse light beams 12. To achieve an optimum input coupling efficiency the peripheral surface 13 may, for example, have an anti-reflecting coat for the emission wavelength region of the diode laser 17.

To increase the divergence of the input transverse light beams 12 and hence achieve a more uniform distribution of the light coupled into the peripheral surface 13, the peripheral surface 13 may also be textured so that the transverse light beams 12 are diffused at the textures of the peripheral surface 13. Such a diffusion effect is achieved, for example, by the typically roughly ground peripheral surfaces of known lenses. By virtue of the size and distribution of the textures on the peripheral surface the diffusion effect may be purposefully influenced.

On the one hand, the purposeful adjusting of the temperature distribution in the lens 1 may be used to optimize the imaging properties of said individual lens. Alternatively, it is also possible to adjust the temperature distribution in the lens 1 in such a way that the imaging properties of the lens 1 thus produced may be used to compensate image defects of the entire optical arrangement. To said end, with the aid of the input transverse light beams 12 the heating effects resulting from the residual absorption of the projection light beam 2 are deliberately over-compensated. The previously described iterative adjustment of the temperature distribution in the lens 1 by means of the sensor arrangement 21 is one example of such compensation of image defects of other optical elements of the optical arrangement of the projection printing installation since, as a result of monitoring of the focal plane of the optical arrangement, the overall imaging quality of the latter is optimized.

Figure 2:
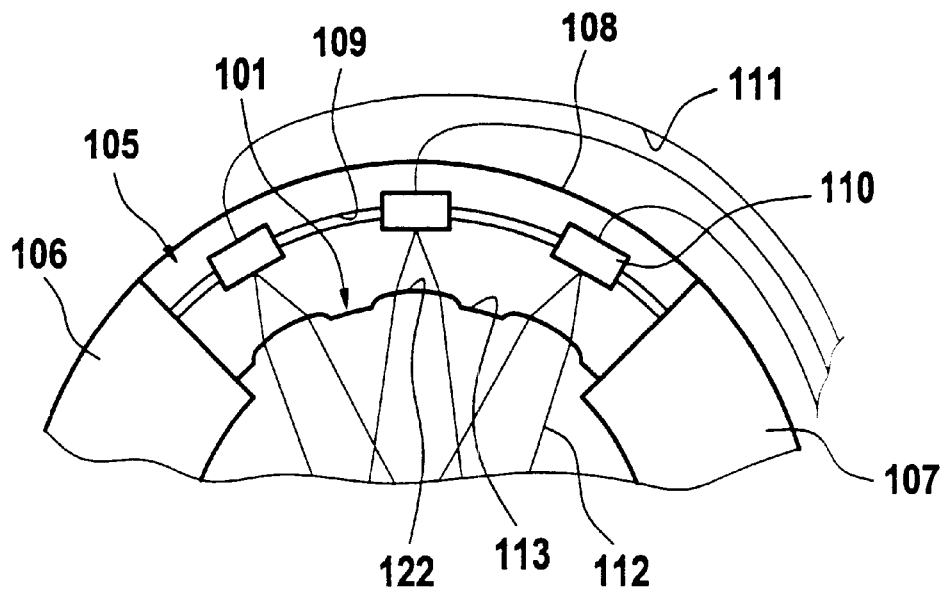
FIG. 2: a view, similar to FIG. 1, of a cutout of an alternative form of construction.
Figure 3:
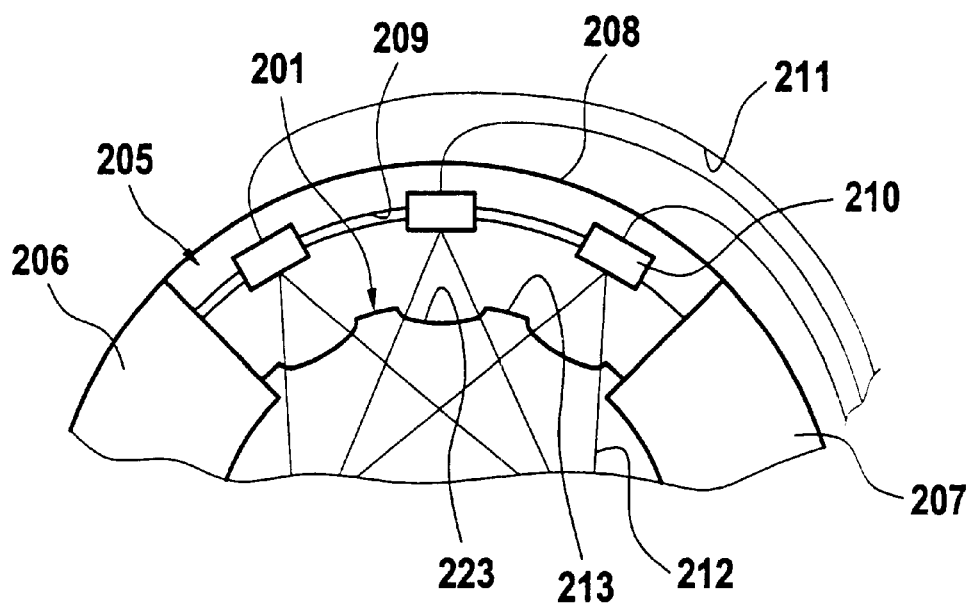
FIG. 3: a view, similar to FIG. 2, of a further alternative form of construction.

For shaping the transverse light beams 112, 212, the lens 101, 201 may be faceted in the manner shown in FIGS. 2 and 3. Structural elements of said alternative forms of construction which correspond to those of FIG. 1 bear reference numbers increased by 100 and 200 and are not described in detail again.

In FIG. 2, the peripheral surface 113 of the lens 101 has convex facets 122 which are associated with the respective transverse light beams 112 in such a way that the latter penetrate the lens 101 in the region of the facets 122. The facets 122 are convexly curved both in a plane perpendicular to the optical axis of the lens 101 (drawing plane of FIGS. 2 and 3) and in the meridional plane, perpendicular thereto, containing the centre of the respective facet 122.

Because of the convexity of the facets 122 the transverse light beams 112 upon entering the latter are concentrated to a greater extent than in the situation illustrated in FIG. 1, where no facets are provided. A concentration of the transverse light beams 112 is additionally effected by the facets 122 also in the plane at right angles to FIG. 2.

Said greater concentration leads to a corresponding concentration of the transverse light beams 112 inside the lens 101 and hence to a changed shape of the superimposed region of the transverse light beams 112 and consequently to a changed temperature distribution inside the lens 101 as a result of the absorption of the transverse light beams 112.

Concave facets 223 as illustrated in FIG. 3, given suitable adaptation of the radius of curvature of the facets 223 to the output divergence of the transverse light beams 212, result in said output divergence remaining practically unchanged upon entry into the lens 201 because the concave facet surfaces are perpendicular to the direction of emission of the transverse light beams 212 and so no refraction occurs at the facet surfaces. The region in the lens 201 which is heated as a result of the absorption of the transverse light beams 212 is therefore enlarged compared to the situations which are illustrated in FIGS. 1 and 2.

Instead of an infrared light source with a wavelength, which is greater than 4 $\mu$m and absorbed to a relatively great extent by the lens material, it is possible to use a light source with a wavelength, at which the lens material has a comparatively low absorption coefficient. Such light sources are commercially available at relatively low cost.

An embodiment having such a light source is illustrated in FIG. 4. Structural elements of said alternative form of construction which correspond to those of FIG. 1 bear reference numbers increased by 300 and are not described in detail again.

Here, the laser is an indium-phosphide diode laser. The wavelength of the input light beam 316 emitted by said laser lies in the region of 1400 nm, in which the lens 301 made of quartz glass presents an increased intrinsic absorption which, however, does not equal the absorption at wavelengths greater than or equal to 4 $\mu$m. Via a change of the temperature of the laser 317 the emission wavelength of said laser is tunable in a specific region.

Because of the lower absorption the transverse light beams 312 travel across the lens 301. All of the transverse light beams 312 overlap in a central, rotationally approximately symmetrical region, which lies inside the projection light beam 302 and does not itself influence the rotational asymmetry of the temperature distribution. The sought-after rotational symmetry is achieved by the regions of the transverse light beams 312 lying outside of the projection light beam 302.

A change of the wavelength of the diode laser 317 leads to a change of the absorption of the transverse light beams 312 because, in the case of the conventional lens materials, the specific absorption of the material varies with the wavelength.

The setpoint value for the wavelength is relayed by the printing control circuit 320 to the diode laser 317. The temperature of the diode laser 317 is used to adjust the emission wavelength in accordance with said setpoint selection.

Via adjustment of the total output and the wavelength of the transverse light beams 312 and, moreover, of the distribution of the output among the six transverse light beams 312 coupled into the lens 301, the shape of the temperature distribution in the lens 301 may be influenced. Via the feedback on the basis of the imaging quality measured by the sensor arrangement 321, in an iterative process a temperature distribution for minimizing the image defects of the lens 301 may be adjusted in the same manner as was described for the embodiment of FIG. 1.

Instead of a lens 1, 101, 201, 301 it is possible to use an optical element which is reflective as regards the projection light beam 2, 302, i.e. a mirror. The mirror has a coat which reflects the projection light beam, e.g. a multi-layer interference coat or a metallic coat applied on a substrate, which is transparent to the compensating light beam and into which, in the manner described above, the transverse light is coupled. A typical substrate material is Zerodur with an optical transparency range between 400 nm and 2500 nm and a region of increasing optical absorption above 2500 nm.

What is claimed is:

1. An optical arrangement, in particular a microlithographic projection printing installation, in particular having a slot-shaped image field or rotationally non-symmetrical illumination, a) comprising an optical element;

b) comprising a projection light source which emits radiation, wherein the surface of the optical element is acted upon by the radiation of the projection light source in a rotationally non-symmetrical manner;

c) and comprising a compensating light supply device which supplies compensating light to the optical element, on a region of the optical element where the projection light is not passed, in such a way that the temperature distribution in the optical element arising as a result of cumulative heating of the optical element with projection light and compensating light is at least partially homogenized, wherein the compensating light supply device is optically coupled via the peripheral surface of the optical element to the latter.

2. An optical arrangement as claimed in claim 1, wherein the compensating light supply device (11, 14 to 19; 111; 211; 311, 314 to 319) comprises a light source (17; 317) and at least one optical fibre (11; 111; 211; 311), in which the radiation (16; 316) emitted by the light source (17; 317) is supplied to the optical element (1; 101; 201; 301).

3. An optical arrangement as claimed in claim 2, wherein at least two optical fibres (11; 111; 211; 311) are provided and wherein the light outputs guided in each case through said at least two optical fibres (11; 111; 211; 311) are adjustable independently of one another by a control device (19; 319).

4. An optical arrangement as claimed in claim 3, wherein the control device (19; 319) has a communication link to a sensor (21; 321) monitoring the focal plane of the optical arrangement and processes the signals received from the sensor (21; 321) for control of the light output.

5. An optical arrangement as claimed in claim 4, wherein the sensor (21; 321) is a position-sensitive sensor.

6. An optical arrangement as claimed in claim 5, wherein the sensor (21; 321) is a CCD array.

7. An optical arrangement as claimed in claim 1, wherein the compensating light supply device (11, 14 to 19; 111; 211, 311, 314 to 319) comprises a light source (17; 317) of variable wavelength.

8. An optical arrangement as claimed in claim 2, wherein a holding component (10; 110; 210; 310) for the end of the at least one fibre (11; 111; 211; 311) directed towards the optical element (1; 101; 201; 301) is attached to a mount (5; 105; 205; 305) for the optical element (1; 101; 201; 301).

9. An optical arrangement as claimed in claim 8, wherein an adjusting device (9; 109; 209; 309) is provided for guiding the holding component (10; 110; 210; 310) in peripheral direction of the optical element (1; 101; 201; 301).

10. An optical arrangement as claimed in claim 9, wherein a motor-driven actuator for the adjusting device (9; 109; 209; 309) is provided, which has a communication link to a control device, which in turn has a communication link to a sensor monitoring the focal plane of the optical arrangement and processes the signals received from the sensor for control of the position of the holding components (10; 110; 210; 310).

11. An optical arrangement as claimed in claim 1, wherein the peripheral surface (113, 213) of the optical element (101; 201) has facets (122, 223) at compensating light input regions.

12. An optical arrangement as claimed in claim 1, wherein the peripheral surface (13; 113; 213; 313) of the optical element (1; 101; 201; 301) is textured at compensating light input regions.

13. An optical arrangement as claimed in claim 1, wherein the emission wavelength of the light source (17) is greater than 4 μm.

14. An optical arrangement as claimed in claim 1, wherein the optical element (1; 101; 201; 301) is a refractive optical element.

15. An optical arrangement as claimed in claim 1, wherein the optical element is reflective as regards the radiation of the projection light source (17; 317).

* * * * *